United States Patent
Fielding

(10) Patent No.: US 7,142,254 B2
(45) Date of Patent: Nov. 28, 2006

(54) SELF COMPENSATING VIDEO DATA AMPLIFIER AND DRIVER FOR BROADCAST DATA RECEIVER

(75) Inventor: Victor Fielding, Barnsley (GB)

(73) Assignee: Pace Micro Technology Plc, Shipley (GB)

( * ) Notice: Subject to any disclaimer, the term of this patent is extended or adjusted under 35 U.S.C. 154(b) by 186 days.

(21) Appl. No.: 10/072,197

(22) Filed: Feb. 7, 2002

(65) Prior Publication Data

US 2002/0121928 A1 Sep. 5, 2002

(30) Foreign Application Priority Data

Feb. 8, 2001 (GB) ................. 0103082.4

(51) Int. Cl.
*H04N 5/14* (2006.01)
(52) U.S. Cl. ............ 348/707; 348/678; 348/691; 330/289
(58) Field of Classification Search ........... 348/707, 348/678, 691, 607; 334/5, 6; 330/289; 331/65, 331/66; 455/254, 232.1, 308
See application file for complete search history.

(56) References Cited

U.S. PATENT DOCUMENTS

| | | | |
|---|---|---|---|
| 3,374,361 A | 3/1968 | Callis | |
| 3,418,592 A | 12/1968 | Solomon et al. | |
| 3,560,865 A | 2/1971 | Harford | |
| 3,681,619 A | 8/1972 | Remy | |
| 3,780,219 A * | 12/1973 | O'Toole | 348/654 |
| 3,967,312 A * | 6/1976 | Sample | 348/641 |
| 4,128,698 A * | 12/1978 | Anolick et al. | 428/480 |
| 4,198,652 A * | 4/1980 | Parker | 348/645 |
| 4,218,698 A * | 8/1980 | Bart et al. | 348/600 |
| 4,261,015 A * | 4/1981 | Dakroub | 348/695 |
| 4,318,052 A | 3/1982 | Colles | |
| 4,412,244 A * | 10/1983 | Shanley, II | 348/600 |
| 4,546,343 A * | 10/1985 | Higgins et al. | 341/119 |
| 4,716,315 A * | 12/1987 | Bell | 327/513 |
| 4,924,194 A | 5/1990 | Opas et al. | |
| 5,410,745 A | 4/1995 | Friesen et al. | |
| 5,506,544 A | 4/1996 | Staudinger et al. | |
| 5,661,436 A | 8/1997 | Kresock | |
| 6,304,129 B1 * | 10/2001 | Blair et al. | 327/378 |

FOREIGN PATENT DOCUMENTS

| | | |
|---|---|---|
| EP | 0583991 | 2/1994 |
| EP | 0609053 | 8/1994 |
| EP | 0942524 | 9/1999 |
| GB | 1102208 A | 2/1968 |
| GB | 1477568 A | 6/1977 |

* cited by examiner

*Primary Examiner*—Victor R. Kostak
(74) *Attorney, Agent, or Firm*—Head, Johnson & Kachigian

(57) ABSTRACT

The invention relates to improvements to the operation of a broadcast data receiver (BDR) and, in particular, to the provision of a video data amplifier and driver circuit for the processing of a received video data signal. The circuit includes a means for generating at least one compensatory value and preferably a multiplication factor. The compensatory value is added to the received video data signal as it passes through the circuit to form a combined signal. The combined signal can also be multiplied. The level of the compensatory value can alter with reference to changes in the environment of the operation of the circuit so as to take into account and minimise changes affecting the operation of the circuit and on the video signal.

16 Claims, 1 Drawing Sheet

SELF COMPENSATING VIDEO DATA AMPLIFIER AND DRIVER FOR BROADCAST DATA RECEIVER

CROSS-REFERENCE TO RELATED APPLICATIONS

This applications claims priority to British Patent Application No. 0103082.4 filed 8 Feb. 2001.

STATEMENT REGARDING FEDERALLY SPONSORED RESEARCH OR DEVELOPMENT (N/A)

The Names of the Parties to a Joint Research Agreement (N/A)

Incorporation-by-Reference of Material Submitted on a Compact DISC (N/A)

BACKGROUND OF THE INVENTION

The invention which is the subject of this application relates to improvements to the operation of a broadcast data receiver (BDR) and, in particular, to the provision of a video data amplifier and driver circuit therefor.

A BDR is typically one of a large number of the same provided at various locations to receive common data streams broadcast from a remote location by a broadcaster or number of broadcasters. Each BDR typically receives a number of data streams transmitted at different frequencies and to which the BDR selectively tunes in response to user selections, such as to receive a particular television channel. At least one of the data streams includes a video signal carrying video data.

The BDR is typically provided to receive and process video data, audio data and auxiliary data via the data streams. Once received the BDR processes the same so as to allow generation of video, audio and/or auxiliary data such as an Electronic Programme Guide on a display screen and/or speakers as appropriate.

Upon reception the video, audio and auxiliary data, which is typically encoded for the purposes of efficient transmission, is identified, split and processed in accordance with industry standards to allow the decoding and generation therefrom of, for example, the video display to the user.

This invention is primarily directed towards the processing of the video data and, in order to allow the processing of the video data, there is typically provided within the broadcast data receiver amplifiers such as simple discreet amplifiers. However, for the same to be able to receive the video signal, which is typically transmitted and received with a voltage level between the known voltage range of 0 to 1 volt, a DC offset is required to be introduced to the amplifiers to bias the same on the input transistor.

In practise, it is found that the introduction of the DC offset means that any offset voltage is amplified by the gain value of the amplifier and hence appears as an amplified DC offset on the output of the same which is undesirable. Furthermore, the operating temperature of these components can change through time and use and said changes can influence and be influenced by the particular operating environment in which the BDR is located and over which the BDR manufacturer has little or no control other than being able to provide to the user general usage advice and hope that the user adheres to the advice. Thus, in practice any temperature change effects tend to be amplified, and appear as a further DC offset on the output of the amplifier which again is a problem in the operation of the video data amplifier and driver circuit in terms of possible malfunction and incorrect processing of the received video data which in turn can lead to the video display for the user being incorrect.

Conventionally, attempts to solve the problem have foundered in that while a particular circuit or DC supply arrangement may solve a particular problem at particular temperatures of operation of the BDR, if the operating environment conditions change then the conventional solutions do not prove to be a solution in the changed operating environment. In some instances the conventional solutions may exacerbate the problem when the environmental conditions change.

Thus, to date, this type of problem has been regarded as being something which has to be tolerated.

The aim of the present invention is to provide a solution to these problems and furthermore, to provide a solution which is adaptable in that changes in operating conditions of the components can be taken into account.

BRIEF SUMMARY OF THE INVENTION

In a first aspect of the invention, there is provided a Broadcast Data receiver apparatus (BDR) for receiving at least one signal carrying video data, said signal transmitted from a video data encoder, said signal having a voltage value within a known voltage range and said signal is required to pass through at least one amplifier in the processing of the same and characterized in that the BDR is provided with a video data amplifier and driver circuit which in operation is adaptable in response to changes in the environmental conditions in which the BDR operates and compensates for said changes in the environmental conditions via the generation of a level of DC offset on an input transistor of the video data amplifier and driver circuit, said DC offset value added to the video data signal to form a combined signal.

In one embodiment the environmental change relates to a change in temperature. In addition or alternatively the change in environmental condition includes the change in level of amplification of the bias voltage.

In one embodiment the compensation in the video data amplifier and driver circuit provides a DC offset at the input transistor of a calculated compensatory value.

In one embodiment the known voltage range of the video signal is 0V to 5V but more typically is between is 0 to 1V.

In a further aspect of the invention there is provided a method of processing a received video data signal by a broadcast data receiver(BDR), said method including receiving the video signal having a voltage value within a known voltage range and said signal is required to pass through at least one amplifier in the processing of the same and characterized in that the method includes passing the video signal through a video data amplifier and driver circuit which adapts the video signal as it passes therethrough with reference to the environmental conditions in which the BDR operates and said circuit generates at least one compensatory value which alters with respect to changes in the environmental conditions and which is added to the video signal as the video signal passes through the said circuit to form a combined signal.

In one embodiment the compensatory value is a level of DC offset added to the video data signal to form the combined signal. Typically a video data signal multiplication factor is generated in the circuit and used to multiply the combined signal as it passes through the circuit.

BRIEF DESCRIPTION OF THE DRAWING

A specific embodiment of the invention is now described with reference to the accompanying drawing, which shows one embodiment of a self compensating video data amplifier and driver circuit for a BDR in accordance with the invention.

DETAILED DESCRIPTION OF THE INVENTION

Figure 1:
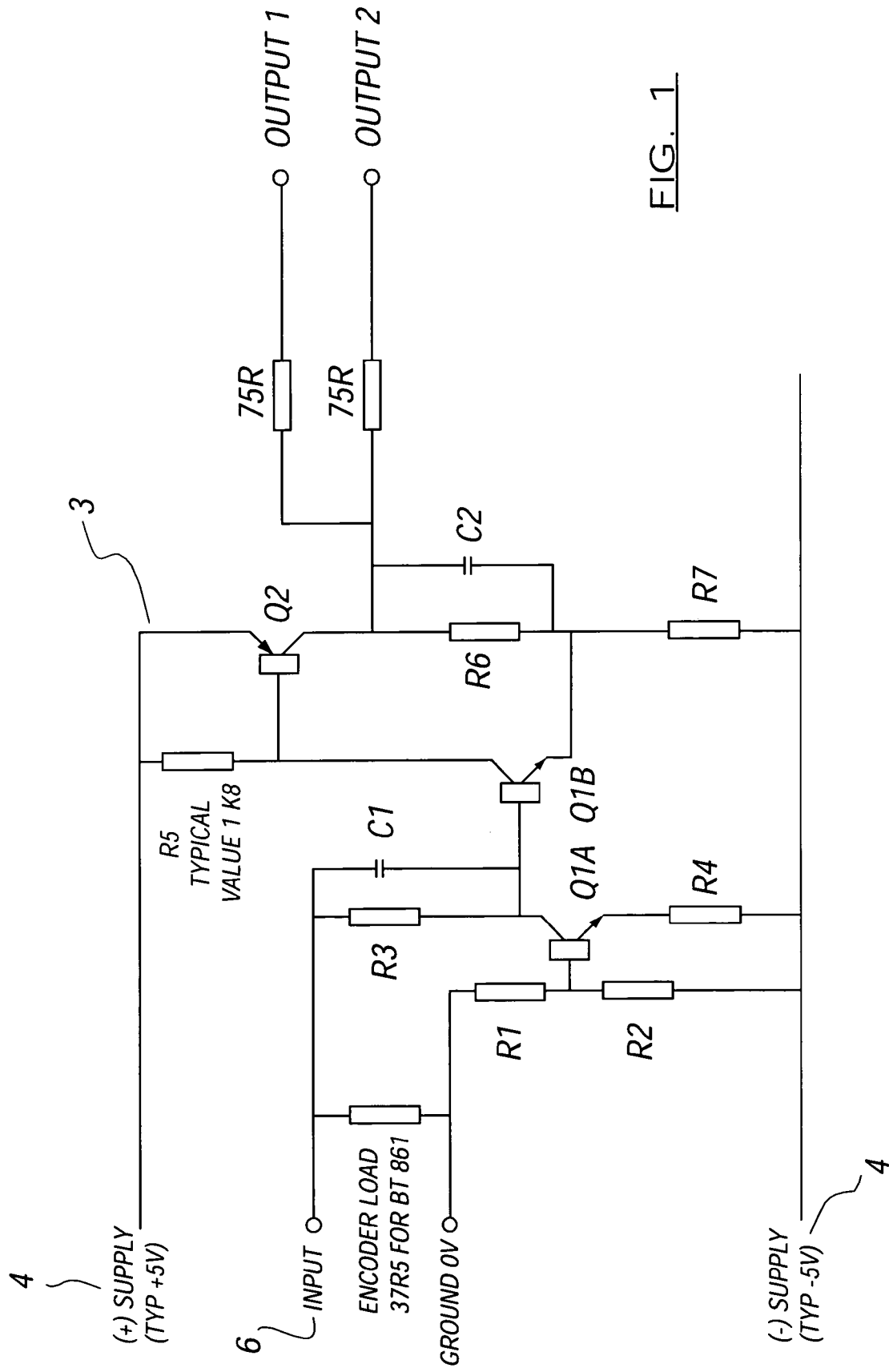

Referring to the drawing there is shown a video data amplifier and driver circuit 3 with a power supply of typically + and −5 volts 4 connected to an input 6 which in turn leads, through the self compensating circuit of resistors, transistors and capacitors as will be described, to output 1 and output 2.

Referring to the circuit diagram, in operation to deal with a video data signal at any particular environmental condition at that instant, if the value of resistor R6 equals the value of resistor R7, then the components of transistor Q1B, resistors R5, R6, R7 and transistor Q2 are used and form a 2 times multiplication (6 db) DC amplifier. The amplifier so formed serves to amplify the voltage level at the emitter of transistor Q1B which in turn is referenced to the negative power supply by a factor of 2.

In this circuit the resistors R1, R2, R4 and transistor Q1A act to provide a constant current supply with a constant voltage drop across the resistor R3. Although constant, the value of the voltage drop is dependent upon the particular current level flowing at that instant and therefore as environmental conditions change so the current level may alter and effect the voltage drop value.

Thus, in practise, and in accordance with the invention, as resistor R3=resistor R4 then any change in the transistor Q1A voltage drop (Vbe) value due to environmental changes, for instance, is passed onto resistor R3 to compensate for changes in the voltage drop (Vbe) at transistor Q1B.

As resistor R1=resistor R2 then the voltage across resistor R4 will have a value which is half of the negative power supply value less the Voltage drop (Vbe) value for transistor Q1A and which is the DC offset value.

If the video data signal received at the input 6 is of a low impedance and applied to resistor R3, it will appear at the base of transistor Q1B. However in accordance with the invention a combined signal is formed which will include a DC offset value in accordance with the invention which is added and which is equal in magnitude to that value across resistor R4 as described above.

Thus, in practise, when this combined signal is applied to the base of transistor Q1B the signal that appears at the emitter of transistor Q1B is in fact the video signal. However as the video signal is offset by half of the value of the negative supply voltage so the x2 gain, which is produced as described above by the components of transistor Q1B, resistors R5, R6, R7 and transistor Q2, is used to amplify the video signal to bring the DC component to ground level and also serves to amplify the video signal by 2.

The capacitors C1, C2 positioned across R3 and R6 respectively are there to provide frequency compensation.

Thus, it will be seen from this invention and the specific example of the same, that the circuit which is provided allows self compensation of the video data signal values dependent on the values of voltage which are entering the circuit at that instant and the environmental conditions which can affect the same. This is achieved by using the input voltage values to provide offset and multiplication values on the video signal as it passes through the amplifier and driver circuit so described.

It may also be possible in one embodiment to include an additional resistor at the position of resistor R3 to overcome any negative outputs which are experienced.

The provision of the self compensating circuit allows relatively simple video amplifiers to be used and the problems conventionally associated with such use to be overcome so that changes in the operation of the same which can be caused by environmental alterations affect the operation of the circuit in a positive manner to alter the compensatory value to be added to the video signal and hence cancel or minimize the adverse effect on the video signal itself.

While the invention has been described with a certain degree of particularly, it is manifest that many changes may be made in the details of construction and the arrangement of components without departing from the spirit and scope of this disclosure. It is understood that the invention is not limited to the embodiments set forth herein for purposes of exemplification, but is to be limited only by the scope of the attached claim or claims, including the full range of equivalency to which each element thereof is entitled.

The invention claimed is:

1. A broadcast data receiver apparatus for receiving at least one signal carrying video data, said signal transmitted from a video data encoder, said signal having a voltage value within a known voltage range and said signal required to pass through at least one amplifier in the processing of the same: said apparatus comprising:
   a video data amplifier and driver circuit that adapts in response to changes in the supply voltage and environmental conditions in which said broadcast data receiver operates;
   said circuit including a single input transistor and two further transistors used in forming an amplifier;
   said circuit compensating for said changes in the supply voltage and environmental conditions via generation of a level of DC offset on said single input transistor; and
   said DC offset value added to the video data signal to form a combined signal.

2. An apparatus according to claim 1 wherein said environmental change relates to a change in temperature.

3. An apparatus according to claim 2 wherein said change in environmental condition includes the change in level of amplification of a bias voltage.

4. An apparatus according to claim 1 wherein the compensation in the video data amplifier and driver circuit provides said DC offset at the input transistor of a calculated compensatory value.

5. An apparatus according to claim 1 wherein said known voltage range of the video signal is 0V to 5V.

6. An apparatus according to claim 5 wherein said known voltage range of the video signal is 0 to 1V.

7. A method of processing a received video data signal by a broadcast data receiver, said method comprising the steps of:
   receiving the video signal having a voltage value within a known voltage range and being required to pass through at least one amplifier in the processing of the same;
   passing the video signal through a video data amplifier and driver circuit including a single input transistor and two further transistors used in forming an amplifier which adapts the video signal as it passes therethrough with reference to the supply voltage and environmental conditions in which the broadcast data receiver operates;

said circuit generating via said single input transistor at least one compensatory value which alters with respect to changes in the supply voltage and environmental conditions; and said at least one compensatory value being added to the video signal as the video signal passes through said circuit to form a combined signal.

8. A method according to claim 7 wherein said compensatory value is a level of DC offset added to the video data signal to form said combined signal.

9. A method according to claim 7 wherein a video data signal multiplication factor is generated in the circuit and used to multiply said combined signal as it passes through the circuit.

10. An apparatus according to claim 1 wherein said change in environmental condition includes the change in level of amplification of a bias voltage.

11. A broadcast data receiver apparatus, said apparatus comprising:

receiving means for receiving at least one signal carrying video data and being transmitted from a video data encoder and having a voltage value within a known voltage range;

at least one amplifier wherein said signal is passed through during processing;

a video data amplifier and driver circuit having a single input transistor and two further transistors used in forming an amplifier said circuit generating a level of DC offset on said input transistor in response to changes in the supply voltage and environmental conditions in which the broadcast data receiver operates and compensating for said changes in the supply voltage and environmental conditions; and said circuit generating a combined signal which includes said DC offset value added to the video data signal.

12. Apparatus according to claim 11 wherein said environmental change relates to a change in temperature.

13. Apparatus according to claim 11 wherein said change in environmental condition includes the change in level of amplification of a bias voltage.

14. Apparatus according to claim 11 wherein the compensation in the video data amplifier and driver circuit provides said DC offset at the input transistor of a calculated compensatory valve.

15. Apparatus according to claim 11 wherein said known voltage range of said video signal is 0V to 5V.

16. Apparatus according to claim 11 wherein said known voltage range of the video is 0 to 1V.

* * * * *